United States Patent
Kurita et al.

(10) Patent No.: US 7,226,513 B2
(45) Date of Patent: Jun. 5, 2007

(54) SILICON WAFER CLEANING METHOD

(75) Inventors: Hisatsugu Kurita, Shibata (JP);
Manabu Hirasawa, Shibata (JP);
Hiromi Nagahama, Shibata (JP); Koji Izumome, Shibata (JP); Takao Ino, Yokohama (JP); Jyunsei Yamabe, Yokohama (JP); Naoya Hayamizu, Yokohama (JP); Naoaki Sakurai, Yokohama (JP)

(73) Assignee: Toshiba Ceramics Co., Ltd., Tokyo (JP)

( * ) Notice: Subject to any disclaimer, the term of this patent is extended or adjusted under 35 U.S.C. 154(b) by 77 days.

(21) Appl. No.: 10/645,911

(22) Filed: Aug. 22, 2003

(65) Prior Publication Data

US 2004/0045580 A1 Mar. 11, 2004

(30) Foreign Application Priority Data

Sep. 5, 2002 (JP) ............................. 2002-259579
Oct. 15, 2002 (JP) ............................. 2002-299769
Jan. 14, 2003 (JP) ............................. 2003-005323

(51) Int. Cl.
*B08B 3/00* (2006.01)

(52) U.S. Cl. .................... 134/28; 134/2; 134/3; 134/26; 216/96; 216/99; 216/108; 438/906

(58) Field of Classification Search .............. 134/2, 134/3, 19, 26, 28, 30; 216/96, 99, 108; 438/906
See application file for complete search history.

(56) References Cited

U.S. PATENT DOCUMENTS

| | | | |
|---|---|---|---|
| 5,492,845 A * | 2/1996 | Fujimaki ................. | 438/585 |
| 5,634,974 A * | 6/1997 | Weimer et al. .......... | 117/103 |
| 6,235,122 B1 * | 5/2001 | Zhang et al. ............ | 134/2 |
| 6,323,140 B1 * | 11/2001 | Mayusumi et al. ..... | 438/787 |
| 6,837,944 B2 * | 1/2005 | Kashkoush et al. .... | 134/28 |
| 2001/0053585 A1 * | 12/2001 | Kikuchi et al. .......... | 438/477 |
| 2002/0160591 A1 * | 10/2002 | Akiyama et al. ........ | 438/530 |
| 2002/0173085 A1 * | 11/2002 | Nakajima et al. ....... | 438/149 |
| 2002/0173173 A1 * | 11/2002 | Kobayashi et al. ..... | 438/795 |
| 2003/0104680 A1 * | 6/2003 | Stefanescu et al. ..... | 438/471 |
| 2004/0127032 A1 * | 7/2004 | Peng et al. .............. | 438/689 |

FOREIGN PATENT DOCUMENTS

| | | | |
|---|---|---|---|
| EP | 1132951 | * | 9/2001 |
| JP | 10-256211 | * | 9/1998 |
| JP | 10-340876 A | | 12/1998 |

OTHER PUBLICATIONS

S. Verhaverbeke et al., "The Effect of $H_2$ Annealing on the Si Surface and Its Use in the Study of Roughening During Wet Chemical Cleaning", Semiconductor Silicon, 1994, pp. 1170-1181, vol. 94-No. 10, The Electrochemical Society, Inc.

Y. Yanase et al., "AFM Observation of Si(100) Surface After Hydrogen Annealing and Wet Chemical Processing", Electrochemical Society 184th Meeting, Third international symposium on Cleaning Technology in Semiconductor Device Manufacturing, Oct. 10-15, 1993, 8 pages.

* cited by examiner

*Primary Examiner*—M. Kornakov
(74) *Attorney, Agent, or Firm*—Foley & Lardner LLP

(57) ABSTRACT

This invention provides a cleaning method of silicon wafer for obtaining a silicon wafer in which micro roughness thereof under spatial frequency of 20/μm is 0.3 to 1.5 $nm^3$ in terms of power spectrum density, by passing a process of oxidizing the silicon wafer with ozonized water and a process of cleaning said oxidized silicon wafer with hydrofluoric acid. Consequently, it is possible to remove surface adhering pollutant such as particles and metallic foreign matter with the surface structure of silicon wafer flattened up to atomic level by annealing maintained.

5 Claims, 6 Drawing Sheets

SILICON WAFER CLEANING METHOD

BACKGROUND OF THE INVENTION

1. Field of the Invention

The present invention relates to a silicon wafer cleaning method and more particularly to a silicon wafer cleaning method for cleaning the silicon wafer with the surface structure of a high-temperature annealed silicon wafer maintained.

2. Description of the Related Art

The surface of a silicon wafer flattened up to atomic level has a so-called step and terrace structure in which layers of silicon atoms are formed in step-like formation. As shown in FIG. 1, this step and terrace structure is comprised of a terrace face 11 which is a sliced face of the wafer, and a step face 12 in which minute steps on atomic level are formed with respect to the terrace face 11.

For example, by annealing at high temperatures of about 1000 to 1200° C. under an environment of hydrogen gas or the like, usually, a step equal to one to three layers of silicon atoms or a step and terrace structure having atomic level step on the surface is formed. This is formed because silicon atoms on the wafer surface are rearranged for stabilization.

The terrace width of the aforementioned step and terrace structure is increased by decreasing an off angle of silicon crystal, so that the annealed silicon wafer surface comes to have a structure flattened up to atomic level.

After the surface is flattened by the aforementioned hydrogen annealing or the like, the silicon wafer is sent to cleaning process of silicon wafer manufacturing process in order to remove particles and metallic foreign matter from the surface of the wafer.

Conventionally, in this cleaning process, RCA cleaning has been employed as a general method.

In the RCA cleaning, SC-1 cleaning liquid composed of ammonia: hydrogen peroxide: pure water=1:1 to 2:5 to 7 (volume mixing ratio) is used to remove, for example, mainly organic pollutant and adhering particles as a cleaning liquid. Further, to remove mainly silicon oxide layer and surface metallic foreign matter, thin hydrofluoric acid (DHF liquid) composed of HF: pure water=1:99 is used, and further to remove mainly surface metallic foreign matter, SC-2 cleaning liquid composed of muriatic acid: hydrogen peroxide: pure water=1:1 to 2:5 to 7 (volume mixing ratio) is used.

However, in the RCA (SC-1) cleaning, silicon on the wafer surface is subjected to anisotropic etching with ammonia and the step and terrace structure formed by annealing with hydrogen gas or the like is vanished, so that the surface roughness (micro roughness) is worsened.

As another cleaning method, a cleaning method using mixing solution of hydrogen fluoride and ozonized water has been disclosed in, for example, Japanese Patent Publication No.10-340876.

According to this method, oxide film is formed on the wafer surface with ozonized water by injecting hydrogen fluoride and ozonized water to the wafer surface at the same time. This method enables particles to be removed without exposing silicon layer in a condition that the contact angle between the wafer surface and hydrogen fluoride is small and the surface is likely to be wet.

However, when hydrogen fluoride and ozonized water are used in mixture, oxide film is formed unequally within a plane on the wafer surface. Thus, this method is incapable of suppressing deterioration of the surface roughness (micro roughness).

With recently intensified integration of semiconductor circuit, miniaturization of a formation device has been demanded and for example, gate oxide film thickness of about 3 nm has been demanded in processing on the level of 0.13 nm in terms of line width.

Corresponding to such a thinned thickness of the oxide film, the fine roughness of the wafer, that is, micro roughness has been demanded to be further reduced in size.

Usually, a silicon wafer is sliced so as to have its crystal orientation of Si (100) plane or Si (111) plane when it is cut off from a single crystal ingot. Particularly, in case of the Si (100) plane, flattening on atomic level is difficult and therefore, the micro roughness has been demanded to be reduced as much as possible.

To remove particles and metallic foreign matter after annealing or obtain a wafer having a clean surface, wafer cleaning process is an indispensable process although the surface roughness (micro roughness) is worsened as described above.

Therefore, technology capable of cleaning a wafer with its step and terrace structure on the wafer surface after annealing maintained, despite any crystal orientation of the wafer surface has been demanded.

SUMMARY OF THE INVENTION

The present invention has been accomplished to solve the above-described technical problem and an object of the present invention is to provide a cleaning method of silicon wafer capable of removing such surface adhering pollutant as particles and metallic foreign matter with the surface structure of silicon wafer flattened up to atomic level by annealing maintained.

To achieve the above object, according to the present invention, there is provided a cleaning method of an annealed silicon wafer for obtaining a silicon wafer in which micro roughness thereof under spatial frequency of 20/μm is 0.3 to 1.5 nm 3 in terms of power spectrum density, by passing a process of oxidizing the silicon wafer with ozonized water and a process of cleaning the oxidized silicon wafer with hydrofluoric acid.

This cleaning method enables the wafer flattened up to atomic level by annealing to undergo oxidation having isotropy with respect to the crystal orientation of silicon single crystal constituting the wafer. By cleaning with hydrofluoric acid after that, adhering particles, metallic foreign matter and the like can be removed by cleaning with the micro roughness on the wafer surface after annealing maintained.

Preferably, the wafer passes a process of oxidizing with ozonized water just after the oxidation treatment process and hydrofluoric acid cleaning process.

By oxidizing with ozonized water again immediately after the oxide film is removed in the aforementioned hydrofluoric acid cleaning process, the surface structure of the wafer formed by the annealing can be maintained further completely.

Preferably, the density, i.e., the concentration, of the ozonized water is 10 to 60 ppm and the density, i.e., the concentration, of the hydrofluoric acid is 0.5 to 2%.

By cleaning within the above-mentioned density, i.e., the concentration, range, the oxidation treatment time and cleaning time can be adjusted easily.

BRIEF DESCRIPTION OF THE DRAWINGS

Hereinafter, the present invention will be described in detail with reference to the accompanying drawings.

DESCRIPTION OF THE PREFERRED EMBODIMENTS

The silicon wafer cleaning method of the present invention is characterized in that an annealed silicon wafer is subjected to hydrofluoric acid cleaning after oxidation treatment with ozone cleaning is carried out.

That is, after a predetermined silicon oxidation treatment, by cleaning an annealed wafer with hydrofluoric acid, adhering particles, metallic foreign matter and the like can be removed by cleaning without damaging the surface structure of a wafer flattened up to atomic level.

The aforementioned oxidation treatment is carried out by cleaning with ozonized water.

Oxidation of silicon single crystal with ozonized water does not have dependency on crystal orientation. That is, because oxidation progress velocity is equal in all crystal orientations, an annealed wafer is oxidized with its wafer surface structure maintained.

Figure 2:
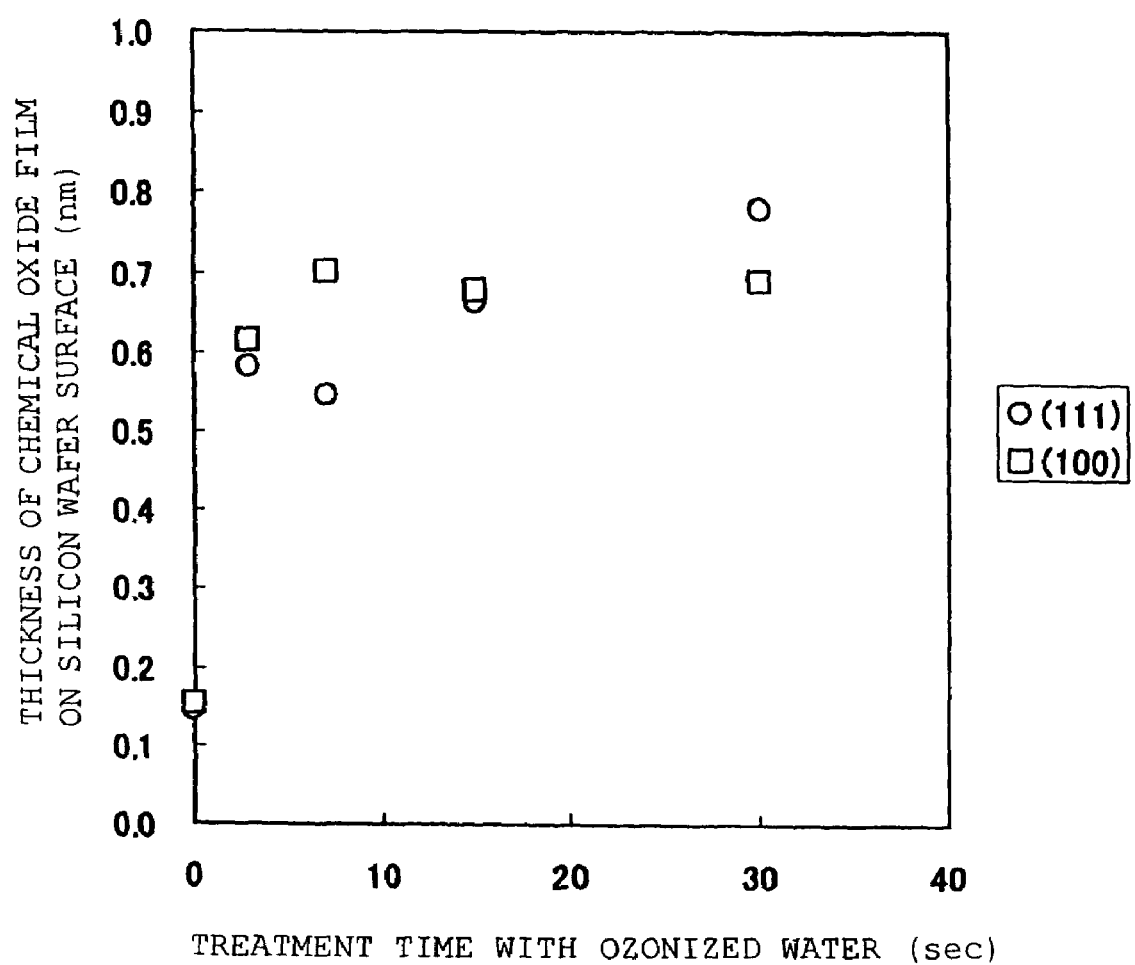
FIG. 2 is a graph showing the relation between a treatment time with ozonized water and the thickness of chemical oxide film on the silicon wafer surface.

FIG. 2 shows the relation between treatment time with ozonized water and the thickness of chemical oxidized film on the silicon wafer surface.

In any case where the crystal lattice orientation of silicon wafer is on Si (111) plane or Si (100) plane as shown in FIG. 2, the thickness of chemical oxide film with ozonized water is constant and oxidation velocity is equal.

Figure 3:
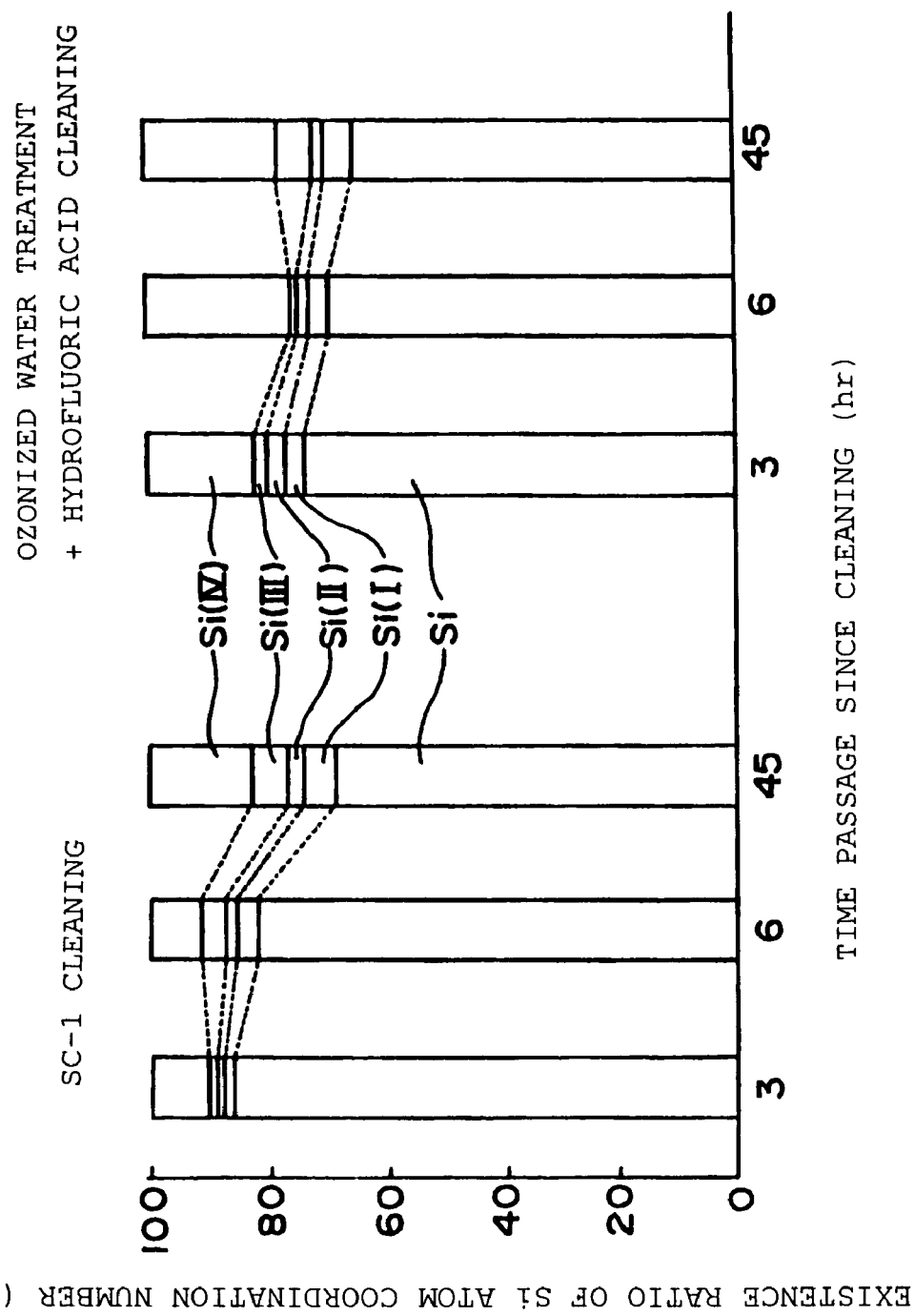
FIG. 3 is a graph showing changes with a time passage of existence ratio of Si atom coordination number measured by XPS analysis in case where a silicon wafer is washed with 1% hydrofluoric acid after it is treated with 20 ppm ozonized water and in case of SC-1 cleaning.

FIG. 3 shows changes with a time passage of existence ratio of Si atom coordination number measured by X-ray photoelectron spectroscopy (XPS) analysis in case where a silicon wafer is washed with 1% hydrofluoric acid after that wafer is treated with 20 ppm ozonized water and in case of SC-1 cleaning.

As shown in FIG. 3, formation ratio of Si (IV) is higher and a change thereof with a passage of cleaning time is smaller in case where hydrofluoric acid cleaning is carried out after treatment with ozonized water than in case of the SC-1 cleaning.

The oxide film, which is formed with ozonized water, is formed with a more stabilized oxidation condition as compared to the chemical oxide film formed by the conventional RCA cleaning with the SC-1 liquid or the like.

The hydrofluoric acid cleaning aims at decomposing and removing oxide film formed on the wafer surface by the oxidation treatment and removing adhering particles, metallic foreign matter and the like on the wafer surface with step and terrace structure on the wafer surface formed by annealing maintained.

Because this hydrofluoric acid cleaning is executed after oxidation treatment with ozonized water, the wafer surface formed by annealing can be washed without damaging the step and terrace structure on the wafer surface formed by the annealing or deteriorating surface roughness (micro roughness) on atomic level.

Further, the wafer surface is desired to be subjected to the oxidation treatment process with ozonized water just after the aforementioned oxidation treatment process and the cleaning process with hydrofluoric acid.

In the hydrofluoric acid cleaning process, if the cleaning time is short, silicon protrusions are formed on the terrace surface of the silicon wafer. This protrusion is about 10 to 30 nm wide and 0.2 to 0.5 nm high and has crystallinity. As the hydrofluoric acid cleaning time is prolonged, the protrusion becomes smaller due to etching action and finally, a flat terrace without any protrusion is formed.

Further, after the hydrofluoric acid cleaning process, silicon wafer surface is oxidized equally without indicating crystal orientation dependency when the oxidation treatment is carried out with ozonized water. Thus, because the wafer surface after the hydrofluoric acid cleaning process is oxidized with its configuration as it is, the wafer surface is never made rough.

However, if the wafer passes the cleaning process with pure water or the like before the oxidation treatment process with ozonized water, the silicon wafer is oxidized unequally from its protrusions and consequently, the wafer surface is made rough.

Oxidation treatment by chemical fluid cleaning with ozonized water or the like and hydrofluoric acid cleaning can be carried out by spraying, immersion or the like as well as by ordinary cleaning method.

Figure 4:
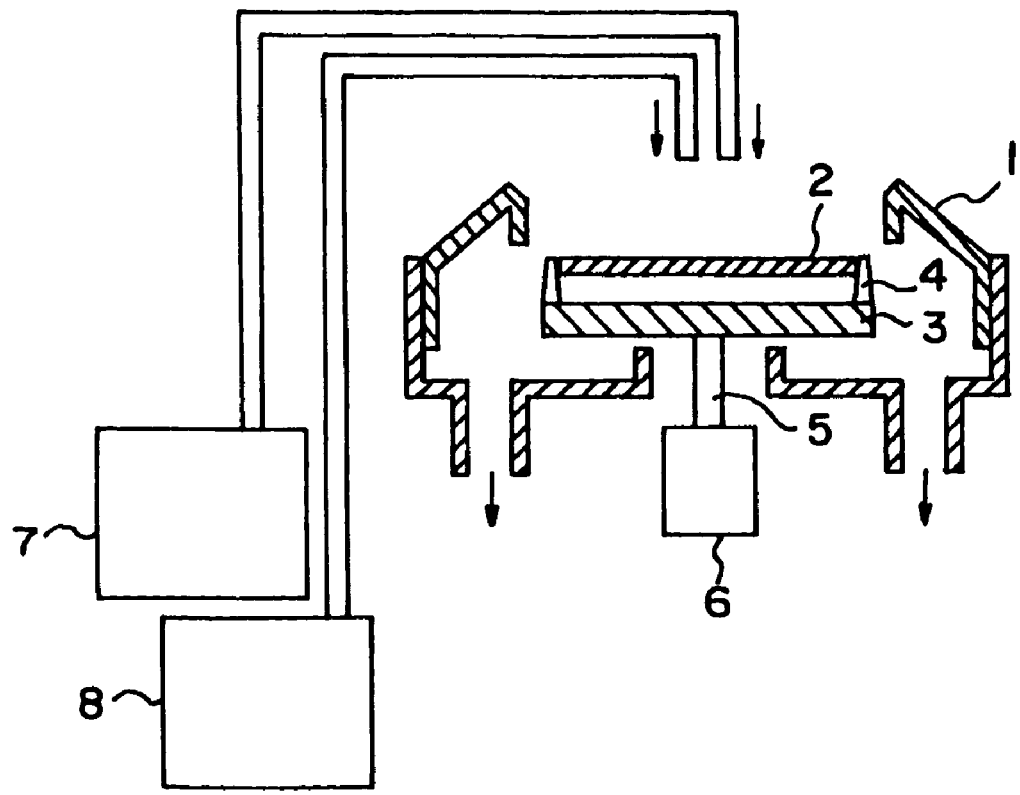
FIG. 4 is a schematic diagram showing an example of a single-wafer spin cleaning system apparatus which executes the cleaning method of the present invention.

In case of spraying, the cleaning method of the present invention can be executed with a single-wafer spin cleaning system apparatus shown in FIG. 4.

In the single-wafer spin cleaning system apparatus, a silicon wafer 2 is disposed on a rotation table 3 in a spin cup 1 through a holding pin 4. The rotation table 3 is rotated by a driving force of a motor 6 through a drive shaft 5 connected through a bottom face.

Then, ozonized water and hydrofluoric acid supplied from an ozonized water tank 7 or a hydrofluoric acid tank 8 is sprayed appropriately on the silicon wafer 2.

After cleaning, waste fluid is discharged to the bottom of the spin cup 1.

Although the density. i.e., the concentration, of the ozonized water is not restricted, it is desired to be 10 to 60 ppm from viewpoints of oxidation treatment time adjustment.

The density, i.e., the concentration, of hydrofluoric acid is desired to be 0.5 to 2% from viewpoints of cleaning time adjustment.

In the meantime, the oxidation treatment time and cleaning time change depending on the ozonized water density, hydrofluoric acid density or the like and therefore, is set up appropriately.

Figure 1:
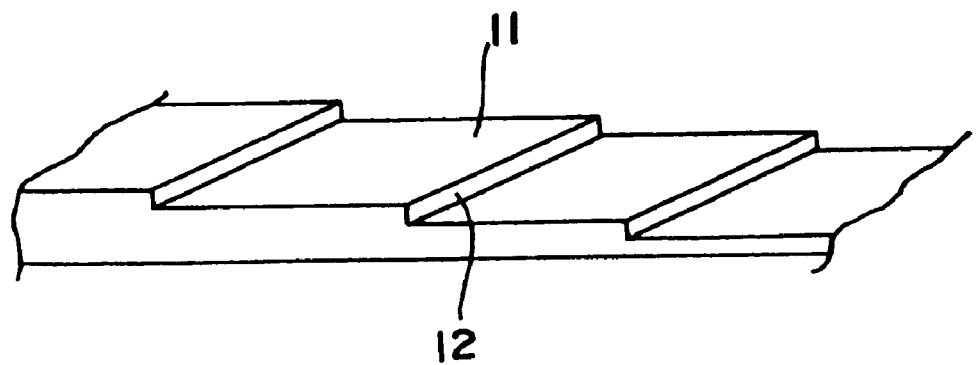
FIG. 1 is a schematic diagram showing a magnified surface of an annealed wafer.

Preferably, a wafer which the cleaning method of the present invention is applied to is an annealed wafer so that its surface is flattened up to atomic level and in which the step and terrace structure is formed on the wafer surface as shown in FIG. 1.

After a silicon single crystal obtained according to Czochralski (CZ) method, floating zone (FZ) method and the like is sliced, a mirrored silicon wafer substrate (prime wafer) is annealed under an environment of reduction gas such as hydrogen, ammonia or inactive gas such as argon, helium, neon at high temperatures of 1000 to 1400° C. for 0.5 to 24 hours. Usually, the silicon wafer is annealed under hydrogen gas environment at high temperatures of about 1200° C. for about an hour.

Even if annealed epitaxial wafer, annealed SOI wafer or the like has the above described surface structure, the effect of the present invention can be obtained.

As for the fine surface roughness (micro roughness) of the annealed wafer, for example, when it is measured with an atomic force microscope (AFM), the wafer surface is preferred to be such that central line average roughness per 1 $\mu m^2$ is about 0.05 to 1 nm, the average roughness ($R_{ms}$) is about 0.05 to 0.1 nm and the maximum roughness ($R_{max}$) is about 0.5 to 1.0 nm, that is, the step is preferred to be composed of 1 to 10 layers of silicon atoms, preferably, 1 to 3 layers.

According to the cleaning method of the present invention, the silicon wafer surface can be washed without generating anisotropy if flattening up to atomic level is difficult as well as if the crystal lattice orientation of the silicon wafer is on Si (111) plane. Thus, the step and terrace structure on the wafer surface formed by annealing treatment can be maintained.

Figure 5:
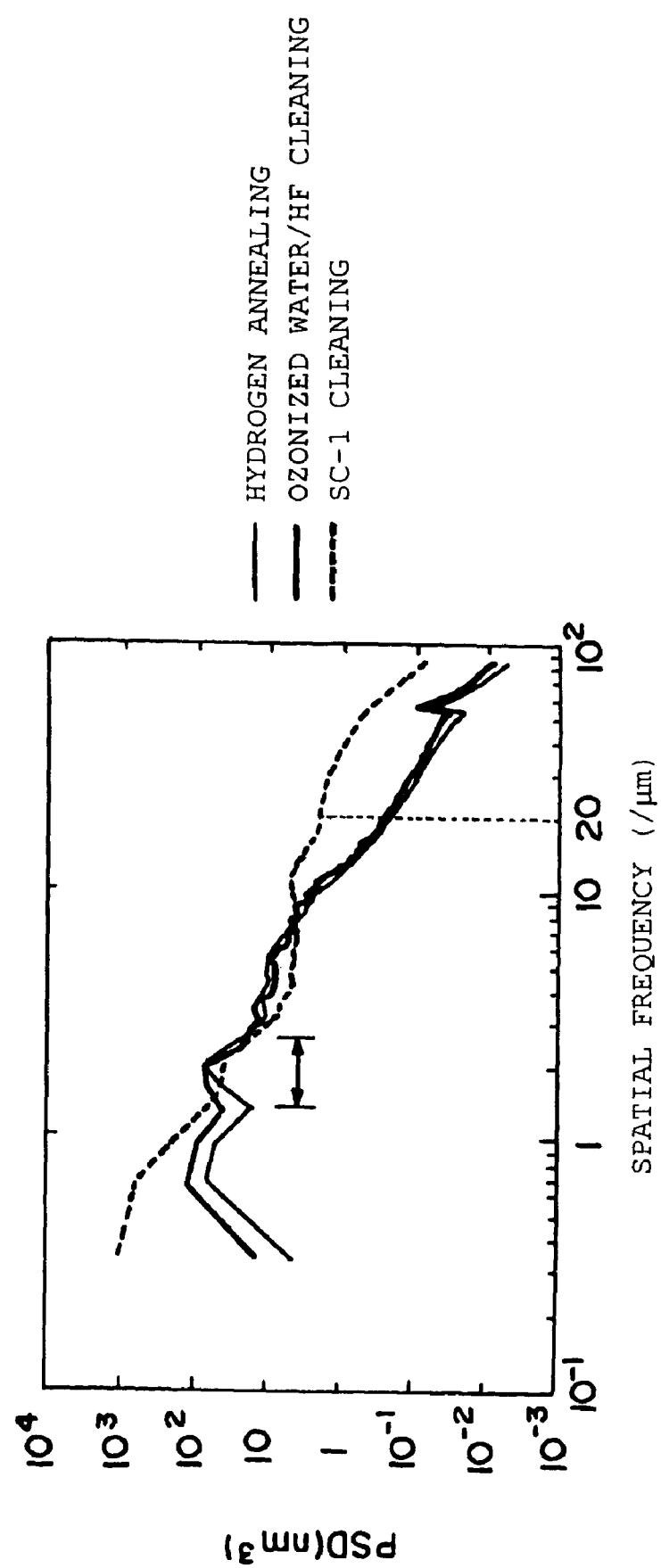
FIG. 5 is a graph showing the relation between spatial frequency (/µm) of a wafer after each cleaning and power spectrum (PSD) ($nm^3$)

As for a silicon wafer washed according to the above described cleaning method, FIG. 5 shows a graph about the relation between spatial frequency (/μm) and power spectral (PSD)(nm$^3$). As shown by the graph of FIG. 5, the silicon wafer washed according to the above-described cleaning method indicates substantially the same inclination as PSD after hydrogen annealing treatment is performed, and then, its micro roughness is maintained.

On the other hand, although the silicon wafer after the SC-1 cleaning indicates substantially the same inclination as the PSD after the hydrogen annealing treatment is performed under spatial frequency of 1 to 10/μm, PSD peak originating from the step and terrace structure near 2 μm in terms of spatial frequency is not recognized.

That is, although in the SC-1 cleaning, the step and terrace structure by the hydrogen annealing treatment is vanished, the micro roughness after the hydrogen annealing treatment is performed is maintained in a silicon wafer washed according to the cleaning method of the present invention.

Further, as evident from the graph of FIG. 5, if the micro roughness under the spatial frequency of 20 μm is in a range of 0.3 to 1.5 nm$^3$ in terms of power spectrum density, the micro roughens after the hydrogen annealing is maintained so that the effect of the cleaning method of the present invention can be found.

Although hereinafter, the present invention will be described about examples thereof further in detail, the present invention is not restricted to the following Examples.

EXAMPLE 1

First, a mirrored P-type Si (100) prime wafer 8 inch in diameter, annealed under hydrogen environment at 1200° C. for an hour, was prepared.

This wafer was subjected to hydrofluoric acid cleaning after oxidation treatment with 30 ppm ozonized water.

The central line average roughness ($R_a$), average roughness ($R_{ms}$), the maximum roughness ($R_{max}$) and absence/presence of step and terrace structure per 3 $\mu m^2$ were evaluated through the atomic force microscope (AFM).

Table 1 shows these results.

Further, FIG. 5 shows a graph about the relation between the spatial frequency (/μm) and the power spectral (PSD) (nm$^3$) for a wafer after cleaning.

For comparison, the surface roughness (micro roughness) and absence/presence of the step and terrace structure were evaluated about a wafer after mirror treatment and a wafer after annealing in the same way as the example 1.

COMPARATIVE EXAMPLE 1

A mirrored P-type Si (100) prime wafer 8 inch in diameter was annealed under hydrogen environment for an hour.

This wafer was subjected to the RCA (SC-1) cleaning.

About this wafer, its surface roughness (micro roughness) and absence/presence of step and terrace structure were evaluated like the example 1.

Table 1 shows these results.

FIG. 5 shows a graph about the relation between the spatial frequency (/μm) and power spectral (PSD) of this wafer after cleaning.

COMPARATIVE EXAMPLE 2

A mirrored P-type Si (100) prime wafer 8 inch in diameter was annealed under hydrogen environment for an hour.

This wafer was washed with mixing solution of hydrogen fluoride and ozonized water.

About this wafer, its surface roughness (micro roughness) and absence/presence of step and terrace structure were evaluated in the same way as the example 1.

Table 1 shows these results.

TABLE 1

| | $R_a$ (nm) | $R_{ms}$ (nm) | $R_{max}$ (nm) | Step and terrace structure |
|---|---|---|---|---|
| After mirror treatment | 0.2 | 0.25 | 3.0 | Absence |
| After annealing | 0.07 | 0.09 | 0.9 | Presence |
| Example 1 | 0.07 | 0.09 | 1.0 | Presence |
| Comparative example 1 | 0.2 | 0.25 | 2.5 | Absence |
| Comparative example 2 | 0.19 | 0.24 | 2.4 | Absence |

As shown in Table 1, in case where the conventional RCA cleaning was performed (comparative example 1) or the wafer surface was washed with mixing solution of hydrogen fluoride and ozonized water (comparative example 2), the surface roughness was increased to substantially the same level as a wafer before the annealing treatment was performed. Further, the step and terrace structure formed on the wafer surface was vanished by the annealing treatment.

On the other hand, if the oxidation treatment with ozonized water and cleaning with hydrofluoric acid were carried out (example 1), the surface roughness was hardly changed as compared to the wafer surface roughness after the annealing treatment. Further, it was recognized that flatness on atomic level constituted of terrace and step was maintained.

As shown in FIG. 5, if the oxidation treatment with ozonized water and cleaning with hydrofluoric acid were carried out (example 1), substantially the same inclination as the PSD after the hydrogen annealing treatment was indicated, so that it was recognized that the micro roughness was maintained.

On the other hand, after the SC-1 (comparative example 1), no PSD peak originating from the step and terrace structure near the spatial frequency of 2/μm was recognized, thereby indicating that the step and terrace structure was vanished.

EXAMPLE 2

After the oxidation treatment and cleaning of the example 1, wafer oxide film pressure resistance (TDDB) characteristic was evaluated.

In the meantime, for the TDDB evaluation, voltages were applied to each of 80 cells repeatedly under the condition that gate oxide film thickness is 10 nm, an electrode area was 1 mm$^2$, applied voltage was 9 MV/cm, application time was 100 seconds and temperature was 120° C. and the number of cells in which initial accidental defect occurred was measured.

Table 2 indicates this result.

COMPARATIVE EXAMPLES 3, 4

The evaluation on wafer oxide film pressure resistance (TDDB) after the cleaning in the comparative examples 1, 2 was carried out in the same way as the example 2.

Table 2 shows this result.

TABLE 2

| Repetition number | 10 | 20 | 30 | 40 | 50 |
|---|---|---|---|---|---|
| Example 2 | 0 | 0 | 0 | 0 | 0 |
| Comparative example 3 | 0 | 1 | 3 | 11 | 12 |
| Comparative example 4 | 0 | 2 | 3 | 10 | 13 |

As shown in Table 2, if the RCA cleaning is carried out (comparative example 3) and if the cleaning is executed with mixing solution of hydrogen fluoride and ozonized water (comparative example 4), the surface roughness of the wafer was remarkable and the step and terrace structure was vanished as shown in the comparative example 1 of Table 1. Thus, it was recognized that oxide film pressure resistance characteristic was deteriorated due to repeated application of 40 times or more.

On the other hand, if oxidation treatment with ozonized water and cleaning with hydrofluoric acid were executed (example 2), flatness on atomic level constituted of terraces and steps was maintained after the cleaning as well. Thus, it was recognized that no deterioration in oxide film pressure resistance characteristic was generated despite the repeated applications of up to 50 times.

EXAMPLE 3

A mirrored P-type Si (100) wafer, whose off angle in <100> direction was less than 0.040, was annealed under hydrogen environment at 1200° C. for an hour.

This specimen wafer was oxidized for 30 seconds with 20 ppm ozonized water using the single-wafer spin cleaning system apparatus shown in FIG. 4 and washed by changing the cleaning time using 1% hydrofluoric acid.

Whether or not the surface of the specimen wafer was changed to hydrophobic during cleaning with hydrofluoric acid was recognized visually.

Table 3 shows the result. In Table 3, ○ indicates that the wafer surface was changed to hydrophobic, x indicates that the wafer surface was hydrophilic and Δ indicates an intermediate state between both.

Just after cleaning with hydrofluoric acid, the specimen wafer was oxidized with 20 ppm ozonized water for 30 seconds.

After the cleaning was terminated, the surface structure of the specimen wafer (3 μm×3 μm) and surface average roughness ($R_{ms}$) were measured with the atomic force microscope (AFM).

Table 3 shows these results.

TABLE 3

| Hydrofluoric acid cleaning time (sec) | $R_{ms}$ (nm) | Surface condition |
|---|---|---|
| 0 | 0.07 | x |
| 3 | 0.08 | x |
| 7 | 0.12 | x |
| 15 | 0.15 | Δ |
| 20 | 0.09 | ○ |
| 30 | 0.07 | ○ |

As a result of the above-described cleaning, although in the example 3, the step and terrace structure of a silicon wafer just after the hydrogen annealing was maintained on every specimen wafer, it was recognized that the surface average roughness ($R_{ms}$) differed depending on hydrofluoric acid cleaning time as shown in Table 3.

Further, as shown in Table 3, to maintain the surface structure of hydrogen-annealed silicon wafer completely, it is preferable to prolong the hydrofluoric acid cleaning time sufficiently so as to keep the wafer surface hydrophobic.

REFERENCE EXAMPLE

Like the example 3, a specimen wafer which passed oxidation treatment process with ozonized water and hydrofluoric acid cleaning process was subjected to oxidation treatment with 20 ppm ozonized water.

After the cleaning was terminated, the surface structure and surface average roughness ($R_{ms}$) of the specimen wafer (3 μm×3 μm) were measured with an atomic force microscope (AFM).

Figure 6:
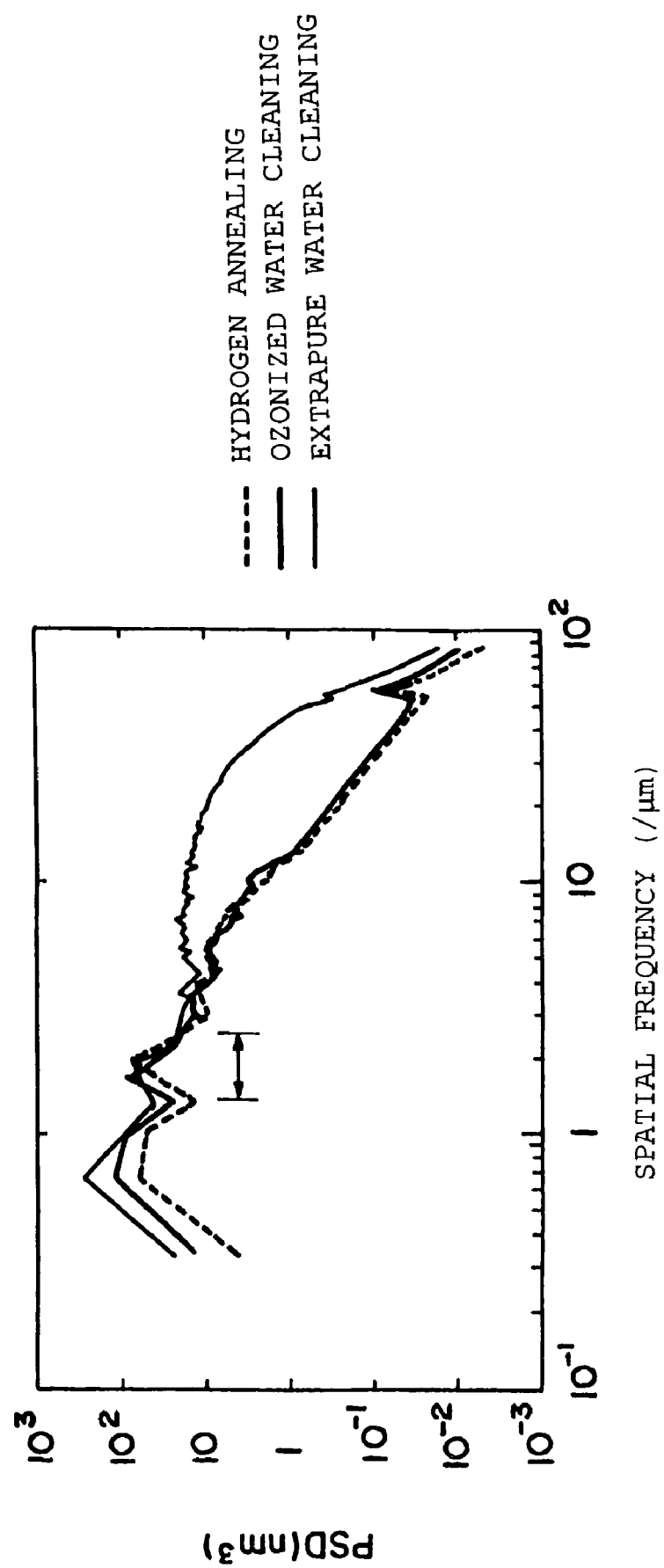
FIG. 6 is a graph showing the relation between spatial frequency (/µm) of a wafer after each cleaning and power spectrum (PSD)($nm^3$) of a reference example.

For comparison, regarding hydrogen-annealed wafer and wafer oxidized with 20 ppm ozonized water after oxidation treatment with ozonized water and hydrofluoric acid cleaning and then cleaning with extrapure water for 30 seconds as well as the above-mentioned washed wafer, the relation between its spatial frequency (/μm) and power spectrum (PSD) (nm$^3$) was expressed in FIG. 6.

As a result, although the silicon wafer step and terrace structure just after hydrogen annealing was maintained, the surface average roughness ($R_{ms}$) was 0.15 nm.

If oxidation treatment is carried out with ozonized water after cleaning with hydrofluoric acid as shown by a graph of FIG. 6, substantially the same inclination as the PSD after hydrogen annealing was indicated, thereby that the micro roughness was maintained being recognized.

On the other hand, if cleaning with extrapure water was carried out after cleaning with hydrofluoric acid, a PSD peak originating from the step and terrace structure was recognized near the spatial frequency of 2/μm as compared to the PSD peak after hydrogen annealing treatment. However, deterioration of the micro roughness was remarkable in spatial frequency of more than 3 μm and it was recognized that a number of protrusions were formed on the terrace face.

Therefore, to maintain the surface structure of hydrogen annealed silicon wafer more completely, it is preferable to carry out oxidation treatment with ozonized water without any cleaning treatment with pure water or the like immediately after cleaning with pure water or the like.

As described above, according to the silicon wafer cleaning method of the present invention, it is possible to remove surface adhering pollutant such as particles and metallic foreign matter with the surface structure of the silicon wafer flattened up to atomic level by annealing maintained.

According to the cleaning method of the present invention, by carrying out the oxidation treatment with ozonized water after oxidation treatment with ozonized water and hydrofluoric acid cleaning, flattening on atomic level can be achieved completely.

Therefore, because a wafer washed according to the method of the present invention maintains micro roughness after annealing and excels in oxide film pressure resistance characteristic, it is possible to provide a silicon wafer preferable for formation of a fine semiconductor device.

What is claimed is:

1. A method of cleaning an annealed silicon wafer, consisting essentially of the steps of:

oxidizing a silicon wafer a silicon wafer annealed under an environment of hydrogen gas with ozonized water;

cleaning the oxidized silicon wafer with hydrofluoric acid; and, as a final cleaning step, oxidizing the silicon wafer with ozonized water, thus obtaining a silicon wafer in which micro roughness thereof under a spatial frequency of 20/μm is 0.3 to 1.5 $nm^3$ in terms of power spectrum density.

2. The method according to claim 1, wherein the final step of oxidizing with ozonized water takes place just after the oxidation step and the hydrofluoric acid cleaning step.

3. The method according to claim 1, wherein the concentration of the ozonized water is 10 to 60 ppm.

4. The method according to claim 1, wherein the concentration of the hydrofluoric acid is 0.5 to 2%.

5. The method according to claim 1, wherein an oxide film is present on the surface of the silicon wafer at the completion of the cleaning method.

* * * * *

UNITED STATES PATENT AND TRADEMARK OFFICE
CERTIFICATE OF CORRECTION

PATENT NO. : 7,226,513 B2 Page 1 of 1
APPLICATION NO. : 10/645911
DATED : June 5, 2007
INVENTOR(S) : Hisatsugu Kurita et al.

It is certified that error appears in the above-identified patent and that said Letters Patent is hereby corrected as shown below:

Column 10, line 1 should read as --oxidizing a silicon wafer annealed under--

Signed and Sealed this

Eighteenth Day of September, 2007

JON W. DUDAS
*Director of the United States Patent and Trademark Office*